(12) United States Patent
Yoo et al.

(10) Patent No.: US 7,705,532 B2
(45) Date of Patent: Apr. 27, 2010

(54) DUAL PLATE TYPE ORGANIC ELECTROLUMINESCENT DEVICE AND METHOD OF FABRICATING THE SAME

(75) Inventors: Choong-Keun Yoo, Incheon (KR); Tae-Joon Ahn, Seoul (KR); Jong-Hyun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 840 days.

(21) Appl. No.: 11/474,903

(22) Filed: Jun. 26, 2006

(65) Prior Publication Data

US 2007/0001594 A1    Jan. 4, 2007

(30) Foreign Application Priority Data

Jun. 30, 2005    (KR) .................. 10-2005-0058441

(51) Int. Cl.
- *H05B 33/00* (2006.01)
- *G09G 3/32* (2006.01)
- *H01J 1/62* (2006.01)
- *H01J 63/04* (2006.01)

(52) U.S. Cl. .............. 313/506; 313/504; 313/507; 313/512; 438/149; 438/167; 428/690

(58) Field of Classification Search ............... None
See application file for complete search history.

(56) References Cited

U.S. PATENT DOCUMENTS 6,351,066 B1    2/2002    Gyoutoku et al.

6,699,728 B2    3/2004    Guenther et al.
2003/0094607 A1*    5/2003    Guenther et al. .......... 257/40
2003/0201445 A1*    10/2003    Park et al. .................. 257/79

FOREIGN PATENT DOCUMENTS

| CN | 1454030 | 11/2003 |
|---|---|---|
| CN | 1608327 | 4/2005 |
| GB | 2 409 758 A | 7/2005 |
| JP | 2003-045668 | 2/2003 |
| WO | WO 03/044875 A1 | 5/2003 |

OTHER PUBLICATIONS

Park, Korean Patent Application 10-2005-0068440_Jul. 2005 machine_translation.*
Office Action issued in corresponding Chinese Patent Application No. 2006100870486; issued May 30, 2008.
Combined Search and Examination Report issued in corresponding British Patent Application No. GB0612839.1 completed on Oct. 11, 2006.

* cited by examiner

*Primary Examiner*—Sikha Roy
*Assistant Examiner*—Tracie Green
(74) *Attorney, Agent, or Firm*—Brinks Hofer Gilson & Lione

(57) ABSTRACT

An organic electroluminescent display device includes first and second substrates facing and spaced apart from each other. A first electrode resides on the first substrate and a separator having dual-layer, reciprocal L-shaped pattern resides on the first electrode. An organic emitting layer having a first thickness resides on the first electrode in a sub-pixel region and a second electrode resides on the organic emitting layer. An array element layer resides on the second substrate, the array element layer including a thin film transistor. A connection pattern electrically connects the second electrode and the thin film transistor.

18 Claims, 8 Drawing Sheets

DUAL PLATE TYPE ORGANIC ELECTROLUMINESCENT DEVICE AND METHOD OF FABRICATING THE SAME

PRIORITY CLAIM

The present invention claims the benefit of Korean Patent Application No. 2005-0058441 filed in Korea on Jun. 30, 2005, which is hereby incorporated by reference.

TECHNICAL FIELD

The present invention relates to an electroluminescent display device and, more particularly, to a dual plate type organic electroluminescent display device and a method of fabricating the same.

DISCUSSION OF THE RELATED ART

Among flat panel displays (FPDs), organic electroluminescent (EL) devices have been of particular interest in research and development because they are light-emitting type displays having a wide viewing angle as well as a high contrast ratio in comparison to liquid crystal display (LCD) devices. Organic EL devices are lightweight and small, as compared to other types of display devices, because they do not need a backlight. Organic EL devices have other desirable characteristics, such as low power consumption, superior brightness and fast response time. When driving the organic EL devices, only a low direct current (DC) voltage is required. Moreover, a fast response time can be obtained. Unlike LCD devices, organic EL devices are entirely formed in a solid phase arrangement. Thus, organic EL devices are sufficiently strong to withstand external impacts and also have a greater operational temperature range. Moreover, organic EL devices are fabricated in a relatively simple process involving few processing steps. Thus, it is much cheaper to produce an organic EL device in comparison to an LCD device or a plasma display panel (PDP). In particular, only deposition and encapsulation processes are necessary for manufacturing organic EL devices.

FIG. 1 is a schematic circuit diagram of an organic electroluminescent display device according to the related art. In FIG. 1, a gate line and a data line cross each other to define a pixel region. A power line is parallel to and spaced apart from the data line. A switching thin film transistor (TFT) "$T_S$" as an addressing element is connected to the gate line and the data line. A storage capacitor "$C_{ST}$" is connected to the switching TFT "$T_S$" and the power line. In addition, a driving TFT "$T_D$" as a current source element is connected to the switching TFT "$T_S$," the storage capacitor "$C_{ST}$" and the power line. The driving TFT "$T_D$" is also connected to an organic electroluminescent (EL) diode "E."

The switching TFT "$T_S$" adjusts a voltage of a gate electrode of the driving TFT "$T_D$" and the storage capacitor "$C_{ST}$" stores charges for the voltage of the gate electrode of the driving TFT "$T_D$." When a forward current is supplied to an organic emitting material layer of the organic EL diode "E," holes and electrons move toward each other through a positive-negative (PN) junction by an anode of hole-supplying layer and a cathode of electron-supplying layer, and are recombined. Since the recombined hole-electron pair has a lower energy than the separated hole-electron pair, a light corresponding to an energy difference between the recombined and separated hole-electron pairs is emitted from the organic emitting material layer.

FIG. 2 is a schematic sectional view showing an organic electroluminescent display device according to the related art. In FIG. 2, first and second substrates 11 and 51 are facing and spaced apart from each other. A first electrode 13 is formed on an inner surface of the first substrate 11. An insulating layer 17 and a separator 20 are sequentially formed on the first electrode 13 in a border region "CA" between adjacent sub-pixel regions "SP." An organic emitting material layer 25 and a second electrode 30 are sequentially formed in the sub-pixel region "SP" between the separators 20. In the manufacturing process, the organic emitting material layer 25 and the second electrode 30 are independently formed in the each sub-pixel region "SP" by a deposition process in which the separator 20 prevents the deposition of continuous layers. The first electrode 13, the second electrode 30 and the organic emitting material layer 25 constitute an organic electroluminescent (EL) diode "E." Although not shown in sectional view of FIG. 2, in plan view, the separator 20 has a lattice shape surrounding each sub-pixel region "SP."

An array element layer 55 including thin film transistors (TFTs; not shown) is formed in each sub-pixel region "SP" on an inner surface of the second substrate 51. A connection electrode 58 is also formed on the inner surface of the second substrate 51 connected to the array element layer 55. A connection pattern 70 is formed in each sub-pixel region "SP" and connects the second electrode 30 of the first substrate 11 and the connection electrode 58 of the second substrate 51.

A seal pattern 80 is formed in a boundary region of the first and second substrates 11 and 51. Accordingly, the inner space between the first and second substrates 11 and 51 is sealed by the seal pattern 80. In addition, the first and second substrates 11 and 51 are attached and sealed under an ambient of inert gas or a vacuum such that the inner space is not exposed to moisture or air.

The separator 20 of the organic electroluminescent display (OELD) device 1 has an inverted taper shape to facilitate the formation of the organic emitting material layer 25 and the second electrode 30 independently in each sub-pixel region "SP." Accordingly, a width of a first portion the separator 20 close to the first substrate 11 is smaller than a width of a second portion of the separator 20 away from the first substrate 11, and the width of the separator 20 decreases as the distance from the first substrate 11 increases. In the manufacturing process, after the separator 20 is formed, the organic emitting material layer 25 is formed by evaporating an organic emitting material. The second electrode 30 is formed by depositing a metallic material. The step coverage of the organic emitting material layer 25 when formed by an evaporation method is better than the step coverage of the second electrode 30 when formed by a deposition method. Accordingly, the organic emitting material is diffused better than the metallic material. In each sub-pixel region "SP," the organic emitting material layer 25 has an area larger than an area of the second electrode 30. As a result, edge portions of the organic emitting material layer 25 are exposed by the second electrode 30. When the organic emitting material layer 25 is exposed, the deterioration of the organic emitting material layer 25 is accelerated. Accordingly, the lifetime of the OELD device 1 is shortened even when the inner space between the first and second substrates 11 and 51 maintains a vacuum condition or an inert gas condition.

Moreover, the separator 20 includes an organic insulating material. The organic insulating material outgases when heated, and the outgasing degrades the organic emitting material. Since the organic emitting material layer 25 does not completely cover the sidewalls of the separator 20, a portion of the organic insulating material is exposed. As a result, outgasing tales place from the exposed portion of the separator 20 when heated and degrades the organic emitting material layer 25. Accordingly, the lifetime of the OELD device 1 is further shortened due to the outgasing.

SUMMARY

Accordingly, the present invention is directed to an organic electroluminescent display device and a fabricating method thereof that substantially obviate one or more of the problems due to limitations and disadvantages of the related art.

To achieve these and other advantages and in accordance with the purpose of the present invention, as embodied and broadly described, an organic electroluminescent display device includes first and second substrates facing and spaced apart from each other. A first electrode resides on the first substrate and a separator including first and second portions resides on the first electrode. Each of the first and second portions having projecting parts that project toward each other and a region that is partially enclosed by the projecting parts. An organic emitting layer resides on the first electrode in a sub-pixel region and has a first thickness. A second electrode resides on the organic emitting layer. An array element layer resides on the second substrate and includes a thin film transistor. A connection pattern electrically connects the second electrode and the thin film transistor.

In another aspect, a method for fabricating an organic electroluminescent display device includes forming a first electrode on a first substrate having a sub-pixel region and a border region surrounding the sub-pixel region. An insulating pattern is formed on the first electrode in the border region, the insulating pattern having a first thickness. An insulating layer is formed on the insulating pattern, the insulating layer having a second thickness. The insulating layer is etched to form first and second projecting parts spaced apart from each other and the insulating pattern is exposed through the first and second projecting parts that are spaced apart from each other. The insulating pattern etched to form first and second regions that are spaced apart from each other, where the first and second regions are undercut with respect to the first and second projecting parts. An organic emitting layer is formed on the first electrode in the sub-pixel region and a second electrode is formed on the organic emitting layer. An array element layer is formed on a second substrate. A connection pattern is formed on one of the second electrode and the array element layer and the first and second substrates are attached, such that the connection pattern electrically connects the second electrode and the thin film transistor.

In a yet another aspect, an organic electroluminescent display includes first and second substrates spaced apart from each other, the first substrate having an electrode thereon. A separator overlies the electrode and defines a pixel region on the first and second substrates. The separator includes reciprocal first and second portions defining a border area of the electrode, each portion including a region overlying the electrode and a projecting part overlying an upper surface of the first pattern and extending beyond an edge of the region. An organic emitting layer overlies the electrode and the projecting part of each portion.

In a further aspect, a method of fabricating a separator for an organic electroluminescent display device includes forming an insulating pattern having a first thickness on a substrate. An insulating layer having a second thickness is formed on the insulating pattern. The insulating layer is etched to form first and second projecting parts spaced apart from each other and exposing a portion of the insulating pattern. The insulating pattern is etched to form first and second region spaced apart from each other and undercutting the projecting parts, such that the first and second portions are recessed under respective first and second projecting parts.

It is to be understood that both the foregoing general description and the following detailed description are exemplary and explanatory and are intended to provide further explanation of the invention as claimed.

DETAILED DESCRIPTION

Reference will now be made in detail to the preferred embodiments of the present invention, examples of which are illustrated in the accompanying drawings.

Figure 1:
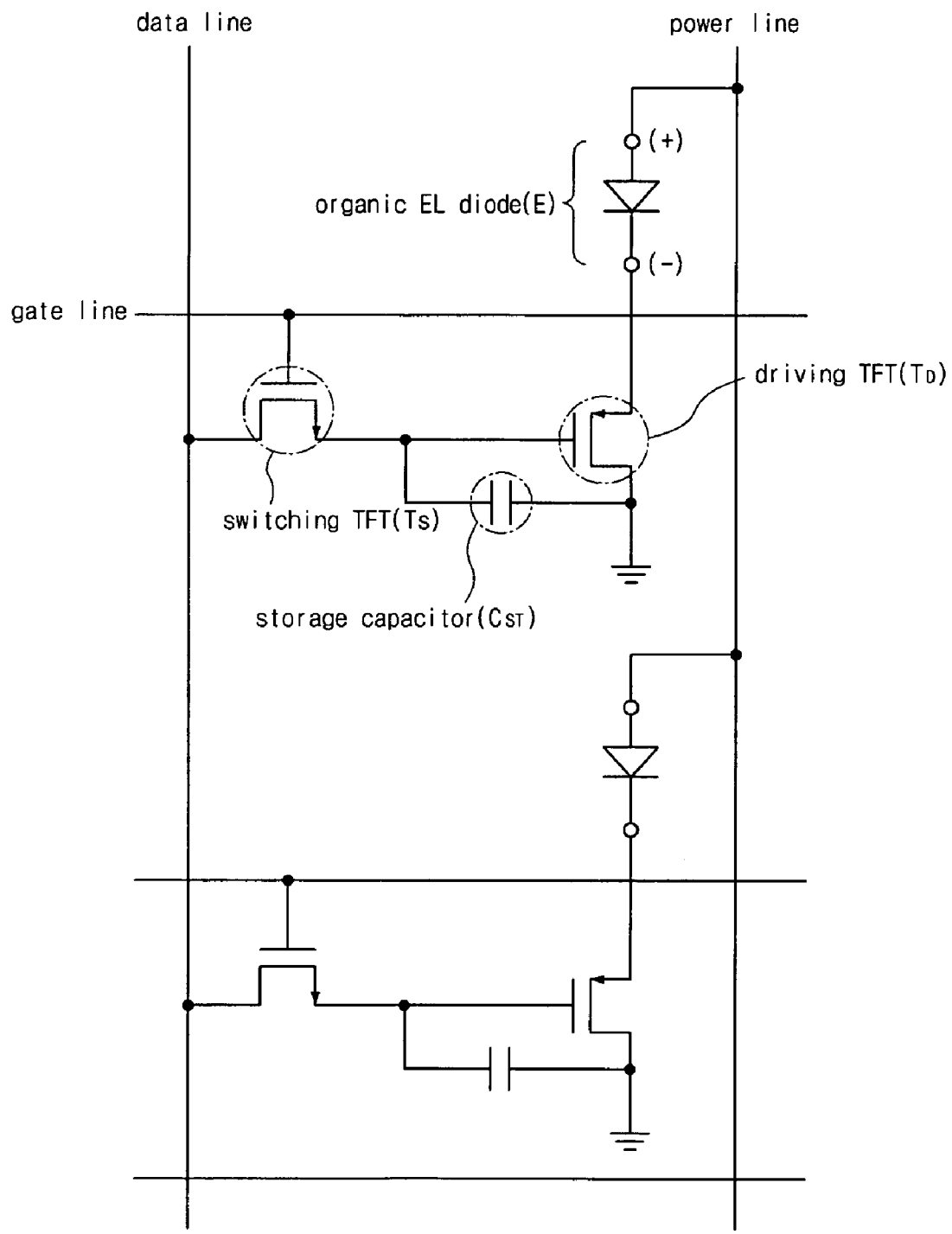
FIG. 1 is a schematic circuit diagram of an organic electroluminescent display device according to the related art.
Figure 2:
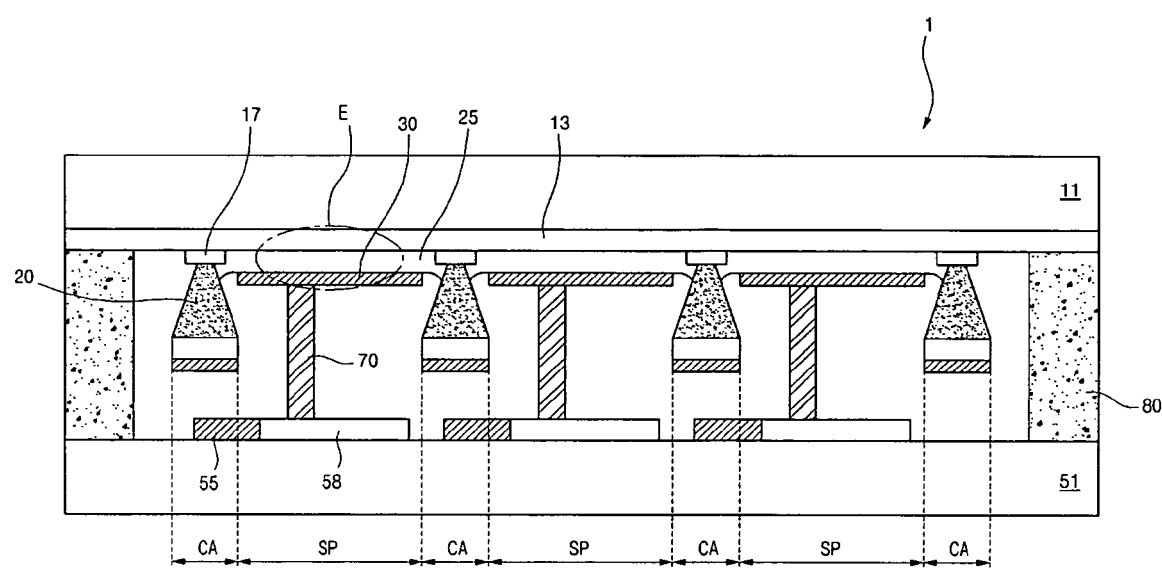
FIG. 2 is a schematic plan view showing an organic electroluminescent display device according to the related art.
Figure 3:
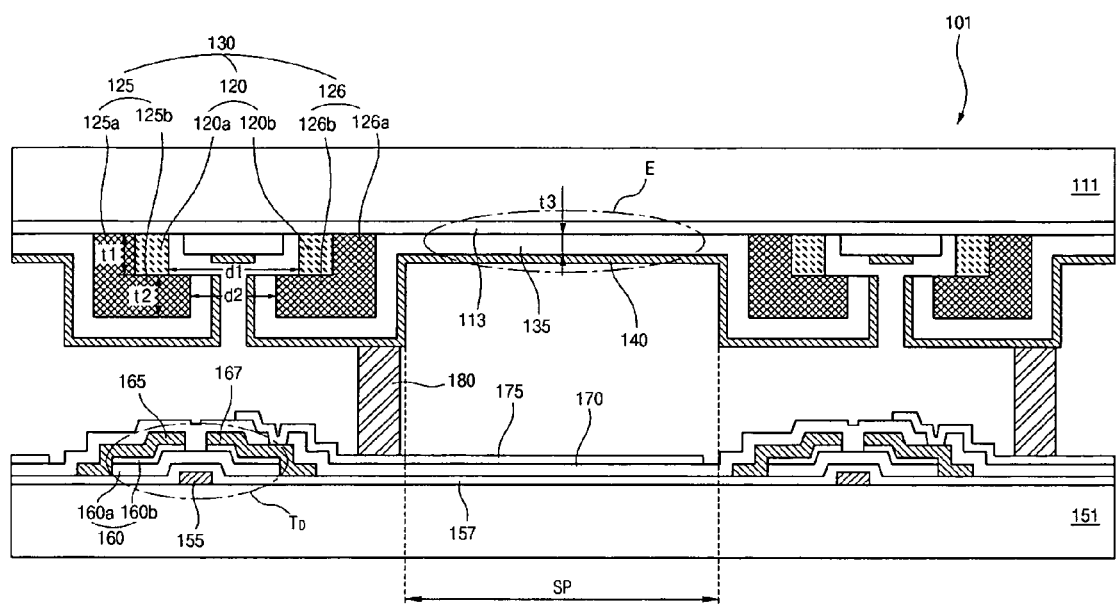
FIG. 3 is a schematic cross-sectional view showing a dual plate type organic electroluminescent display device according to an embodiment of the present invention.

FIG. 3 is a schematic cross-sectional view showing a dual plate type organic electroluminescent display device according to an embodiment of the present invention.

In FIG. 3, a dual plate type organic electroluminescent display (OELD) device 101 includes first and second substrates 111 and 151 facing and spaced apart from each other. An organic electroluminescent (EL) diode "E" is formed on an inner surface of the first substrate 111, and an array element layer including a driving thin film transistor "$T_D$" is formed on an inner surface of the second substrate 151. A connection pattern 180 is formed in a sub-pixel region "SP" between the first and second substrates 111 and 151. The connection pattern 180 electrically connects the array element on the first substrate 111 and the organic EL diode "E" on the second substrate 151.

Even though not shown in FIG. 3, a seal pattern is formed in a boundary region of the first and second substrates 111 and 151 to seal an inner space between the first and second substrates 111 and 151 from exterior air and to attach the first and second substrates 111 and 151. A vacuum is formed in the space isolated by the seal pattern. The seal pattern can also be in the form of a double seal pattern in which two separate patterns are formed that are separated by a small space between the patterns.

Specifically, a first electrode 113 is formed on an inner surface of the first substrate 111 and a separator 130 is formed in a border region "CA" on the first electrode 113. The first electrode 113 includes a transparent conductive material such as an indium-tin-oxide (ITO) and indium-zinc-oxide (IZO). The separator 130 has two portions configured by a double layer construction of inorganic insulating materials. The separator 130 includes two similar portions, where each portion includes a first region 120a, a second region 120b, a first projecting part 125 and a second projecting part 126. The first and second regions 120a and 120b include an inorganic insulating material such as silicon nitride (SiNx) and are spaced apart from each other. Each of the first and second regions 120a and 120b formed on the first electrode 113 has an inner side surface, an outer side surface, a bottom surface contacting the first electrode 113 and a top surface opposite to the bottom surface. The first and second projecting parts 125 and 126 include an inorganic insulating material such as silicon oxide ($SiO_2$) and surround the first and second regions 120a and 120b, respectively. Accordingly, the first projecting part 125 covers the top surface and the outer side surface of the first region 120a, and the second projecting part 126 covers the top surface and the outer side surface of the second region 120b.

In addition, the separator 130 has an undercut shape where the first and second projecting parts 125 and 126 extend over the top surfaces of the first and second regions 120a and 120b, respectively. Accordingly, the first projecting part 125 includes a first section 125a contacting the outer side surface of the first region 120a and a second section 125b extending from the first region 125a. The second section 125b covers and extends over the top surface of the first region 120a. Similarly, the second projecting part 126 includes a third section 126a contacting the outer side surface of the second region 120b and a fourth section 126b extending from the third section 126a. The fourth section 126b covers and extends over the top surface of the second region 120b. As a result, the separator 130 has a rail shape having an inner cavity and an opening on a top surface thereof. The inner side surfaces of the first and second regions 120a and 120b are exposed. Further, a first distance "d1" between the first and second regions 120a and 120b is greater than a second distance "d2" between the second section 125b and the fourth section 126b. A first thickness "t1" of the first and second regions 120a and 120b may be equal to or greater than a second thickness "t2" of the first and second projecting parts 125 and 126. For example, the first and second thicknesses "t1" and "t2" may be within a range of about 2000 Å to about 8000 Å.

An organic emitting material layer 135 is formed on the first electrode 113 in the sub-pixel region "SP" surrounded by the separator 130, and a second electrode 140 is formed on the organic emitting material layer 135. Since the second electrode 140 completely covers the organic material layer 135, the organic emitting material layer 135 is not exposed and deterioration of the organic emitting material layer 135 is prevented. In addition, since an inorganic material does not outgas even when heated, the separator 130 of an inorganic material does not outgas and degradation of the organic emitting material layer 135 due to outgasing is prevented. The first electrode 113, the organic emitting material layer 135 and the second electrode 140 constitute the organic EL diode "E." The first electrode 113 may have a work function higher than the second electrode 140. Moreover, the organic emitting material layer 135 and the second electrode 140 are independently formed in each sub-pixel region "SP" by the separator 130.

Even though not shown in FIG. 3, the array element layer in each sub-pixel region "SP" on the second substrate 151 includes a plurality of TFTs. A connection electrode 175 is connected to the driving TFT "$T_D$" of the array element layer, and the connection pattern 180 is formed on the connection electrode 175. The driving TFT includes a gate electrode 155 covered by a gate insulating layer 160 having two sublayers 160a and 160b. Source and drain regions 165 and 167 overlie sublayer 160b of gate insulating layer 160. In the TFTs in the sub-pixel region and the driving TFT, the conductive layers can be fabricated with polysilicon, amorphous silicon, and organic semiconductor materials.

The connection pattern 180 may be formed on one of the first and second substrates 111 and 151 during a fabrication process for the one of the first and second substrates 111 and 151. Even though the connection pattern 180 is disposed to overlap the separator 130 in FIG. 3, in another embodiment, the connection pattern 180 may be disposed in the sub-pixel region "SP" does not overlap the separator 180. Since the OELD device 101 of FIG. 3 is a top emission type, deterioration in a display quality is prevented even when the connection pattern 180 is disposed in the sub-pixel region "SP" and does not to overlap the separator 180.

FIGS. 4A to 4H are schematic cross-sectional views showing a fabricating process of an electroluminescent substrate for an organic electroluminescent display device according to an embodiment of the present invention. FIGS. 4A to 4H show a single sub-pixel region.

Figure 4A:
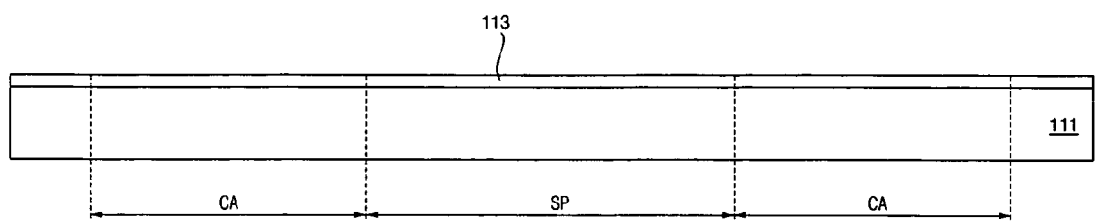
FIGS. 4A to 4H are schematic cross-sectional views showing a fabricating process of an electroluminescent substrate for an organic electroluminescent display device according to an embodiment of the present invention.

In FIG. 4A, a first substrate 111 has a sub-pixel region "SP" and a border region "CA" surrounding the sub-pixel region "SP." A first electrode 113 is formed on the first substrate 111 by depositing a transparent conductive material such as indium-tin-oxide (ITO) and indium-zinc-oxide (IZO).

Figure 4B:
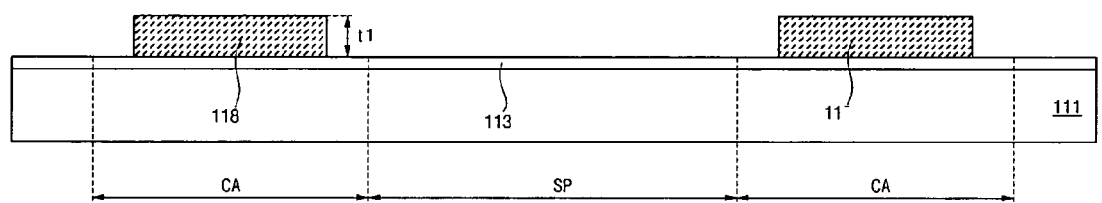

In FIG. 4B, a first inorganic insulating material layer (not shown) is formed on the first substrate 111, and a first photoresist (PR) layer (not shown) is formed on the first inorganic insulating material layer. The first inorganic insulating material layer may have a first thickness "t1" within a range of about 2000 Å to about 8000 Å, and may include silicon nitride (SiNx). Next, a first mask (not shown) having a transmissive area and a blocking area is disposed over the first PR layer, and a light is irradiated onto the first PR layer through the first mask. After a first PR pattern (not shown) is formed by developing the first PR layer, the first inorganic insulating material layer is etched using the first PR pattern as an etch mask to form a first inorganic insulating material pattern 118 in the border region "CA." Accordingly, the first inorganic insulating material pattern 118 may have the first thickness "t1" within a range of about 2000 Å to about 8000 Å. Since the first inorganic insulating material pattern 118 and the bent pattern (125, 126 in FIG. 3), covering the first inorganic insulating material pattern 118, function as a separator for the organic emitting material layer, the first inorganic insulating material pattern 118 is formed to have the first thickness "t1," which is greater than a thickness of the organic emitting material layer. In addition, when additional layers such as an electron injecting layer, an electron transporting layer, a hole transporting layer and a hole injecting layer are further formed on the organic emitting material layer to improve emission efficiency, the first inorganic insulating material pattern 118 is formed to have a thickness greater than a thickness of all the layers. The organic emitting material layer may have a thickness of about 1500 Å.

Figure 4C:
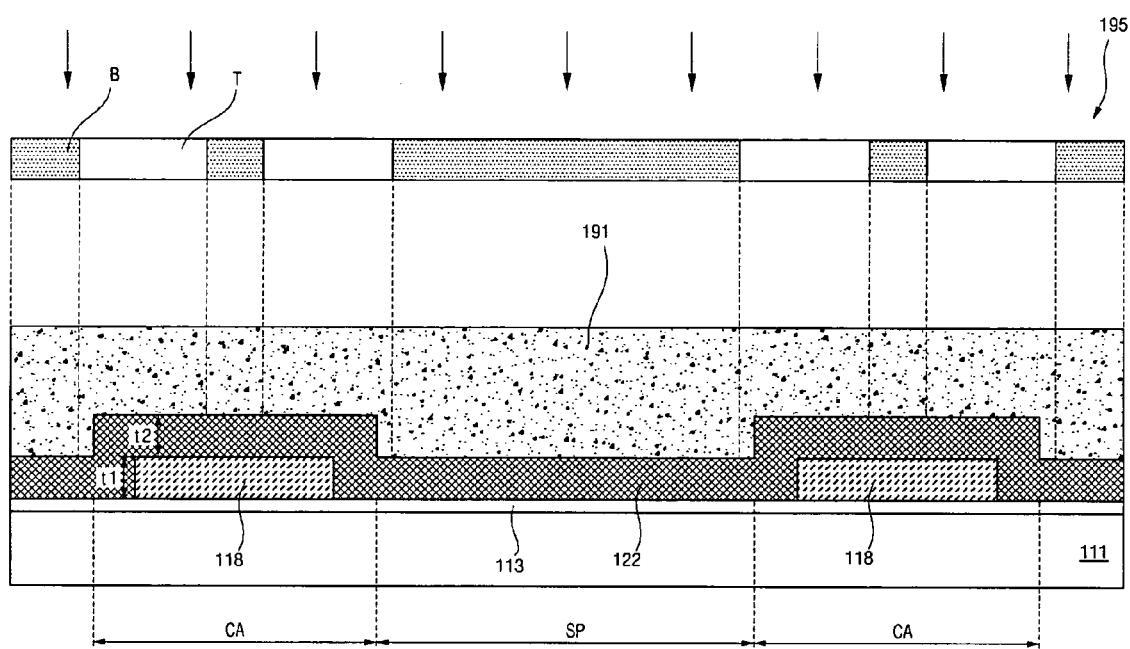

In FIG. 4C, a second inorganic insulating material layer 122 is formed on the first inorganic insulating pattern 118. The second inorganic insulating material layer 122 may have a second thickness "t2" within a range of about 2000 Å to about 8000 Å, and may include silicon oxide ($SiO_2$). To covers the first inorganic insulating material pattern 118 completely, the second thickness "t2" of the second inorganic insulating material layer 122 may be equal to or greater than the first thickness "t1" of the first inorganic insulating material pattern 118. Next, a second PR layer 191 is formed on the second inorganic insulating material layer 122. For example, the second PR layer may be a negative type where an exposed portion is removed. Next, a second mask 195 having a transmissive area "T" and a blocking area "B" is disposed over the second PR layer 191, and light is irradiated onto the second PR layer 191 through the second mask 195.

Figure 4D:
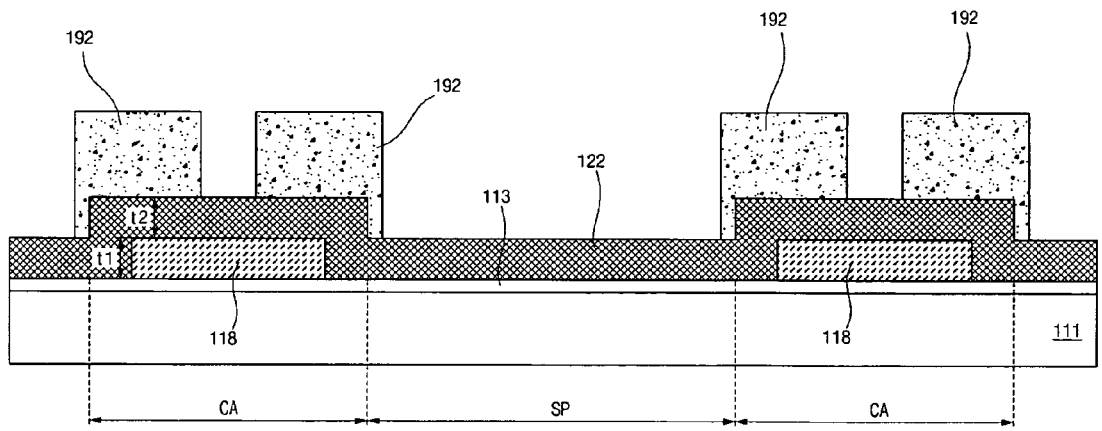

In FIG. 4D, a second PR pattern 192 is formed on the second inorganic insulating material layer 122 by developing the second PR layer 191 (FIG. 4C).

Figure 4E:
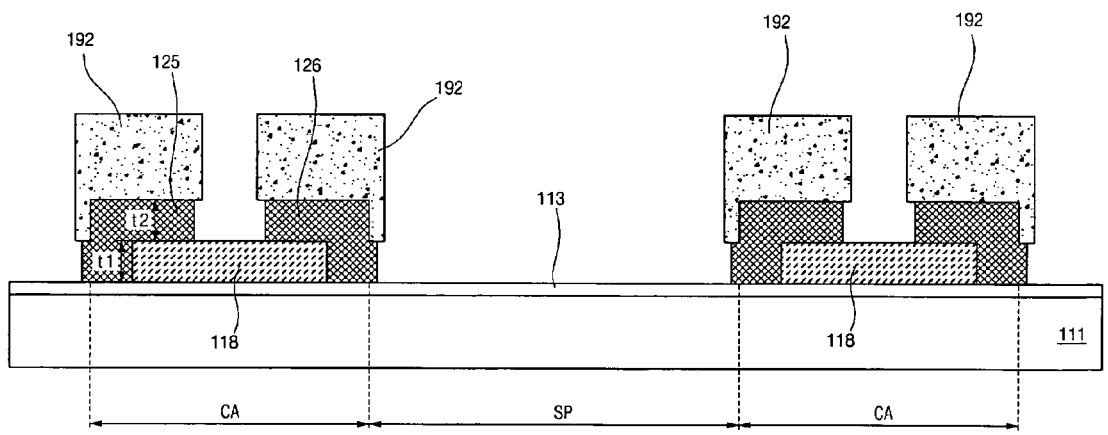

In FIG. 4E, a second inorganic insulating pattern including the first and second projecting parts 125 and 126 is formed by etching the second inorganic insulating material layer 122 (FIG. 4D) using the second PR pattern 192 as an etch mask. The first and second projecting parts 125 and 126 spaced apart from each other are disposed in the border region "CA." Accordingly, through the first and second projecting parts 125 and 126, the first electrode 113 is exposed in the sub-pixel region "SP" and the first inorganic insulating material layer 118 is exposed in the border region "CA."

Figure 4F:
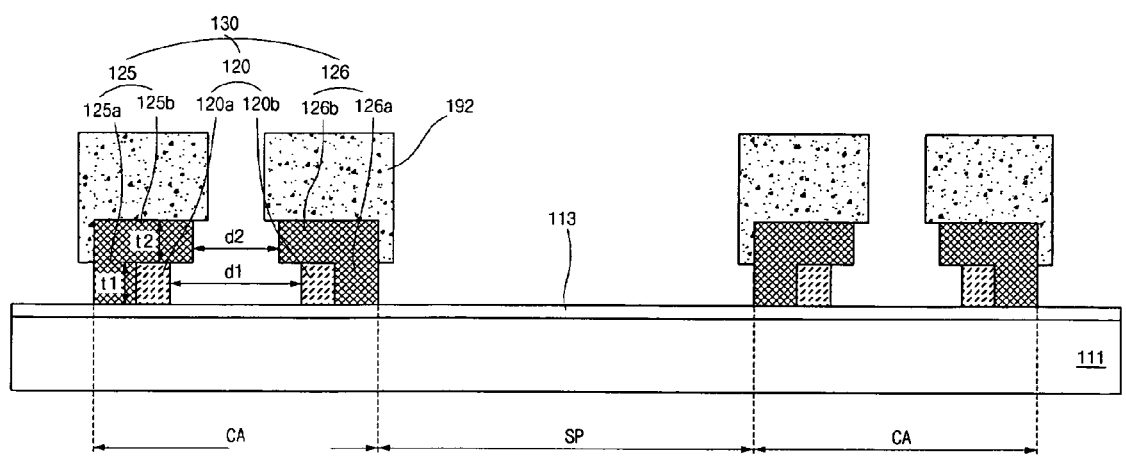

In FIG. 4F, the first organic insulating material pattern 118 (FIG. 4E) exposed through the first and second projecting parts 125 and 126 is etched to form the first and second regions 120a and 120b. Since the first organic insulating material pattern 118 (FIG. 4E) and the first and second projecting parts 125 and 126 include different materials, the first organic insulating material pattern 118 (FIG. 4E) has an etch rate different from an etch rate of the first and second projecting parts 125 and 126. For example, even though the first organic insulating material pattern 118 (FIG. 4E) of silicon nitride (SiNx) and the first and second projecting parts 125 and 126 of silicon oxide ($SiO_2$) can be etched through a dry etching method using $CF_4$ (tetrafluoromethane) gas, the etch rate of silicon nitride (SiNx) with $CF_4$ gas is higher than the etch rate of silicon oxide ($SiO_2$) with $CF_4$ gas. Accordingly, the etched amount of the first organic insulating material pattern 118 (FIG. 4E) is larger than the etched amount of the first and second projecting parts 125 and 126, and the first organic insulating material pattern 118 (FIG. 4E) is etched to expose the first electrode 113 through the first and second regions 120a and 120b. In addition, since the first and second regions 120a and 120b are over-etched, the second section 125b of the first projecting part 125 covers and extends over the top surface of the first region 120a, and the fourth section 126b of the second projecting part 126 covers and extends over the top surface of the second region 120b. As a result, the first and second regions 120a and 120b have an undercut shape with respect to the first and second projecting parts 125 and 126, respectively. The projecting part 125 wraps the top and side surfaces of the first region 120a, and the projecting part 126 wraps the top and side surfaces of the second region 120b.

Therefore, the first region 120a, the second region 120b, the first projecting part 125 and the second projecting part 126 constitute the separator 130 having a two-fold double layer structure. Further, the first distance "d1" between the first and second regions 120a and 120b is greater than the second distance "d2" between the second portion 125b and the fourth portion 126b. Moreover, since outer side surfaces of the first and second projecting parts 125 and 126 are substantially perpendicular to the first electrode 113 differently in an inverted taper structure, the organic emitting material layer and the second electrode completely contact the outer surfaces of the separator 130 without separation from the outer surfaces of the first and second projecting parts 125 and 126.

Figure 4G:
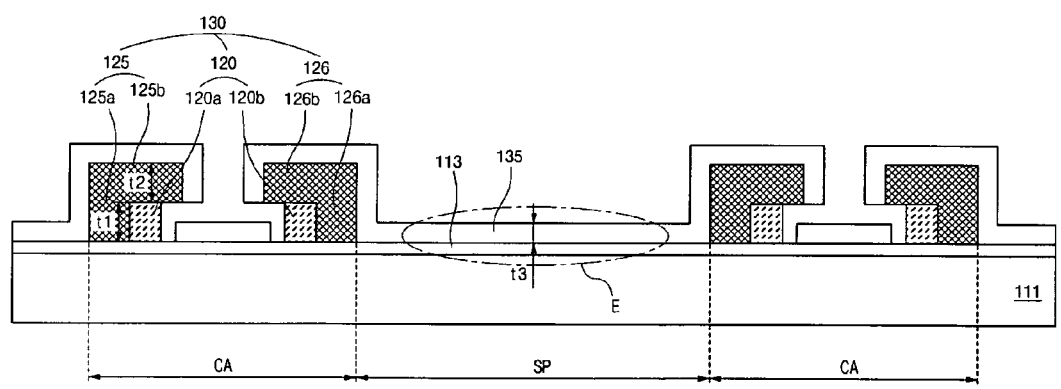

In FIG. 4G, after the second PR pattern 192 (FIG. 4F) is removed through an ashing method or a stripping method, the organic emitting material layer 135 is formed on first electrode 113 in each sub-pixel region "SP." The organic emitting material layer 135 may be formed by evaporating an organic emitting material. The organic emitting layer 135 is cut between the first and second projecting parts 125 and 126 due to the undercut shape of the first and second regions 120a and 120b with respect to the first and second projecting parts 125 and 126, and a dummy organic emitting material pattern is formed on the first electrode 113 between the first and second regions 120a and 120b. Accordingly, the organic emitting layer 135 is separated and is independently formed in each sub-pixel region "SP" by the separator 130.

Figure 4H:
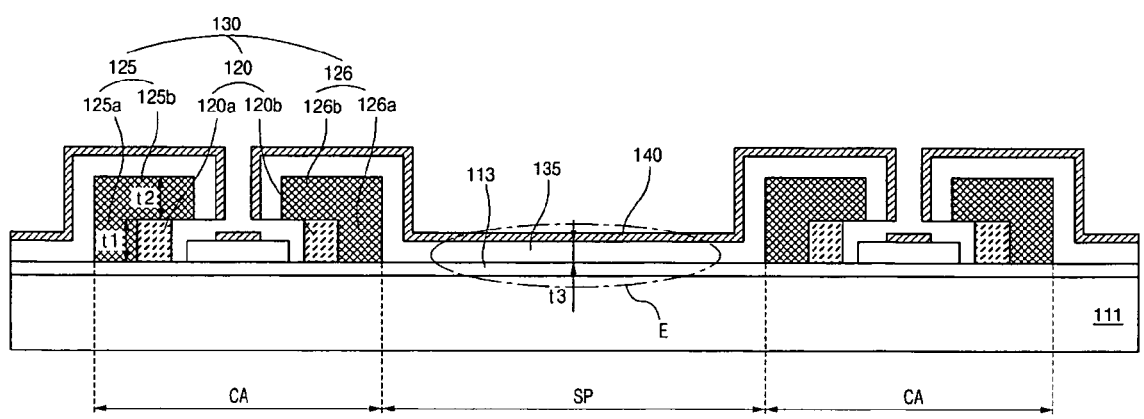

In FIG. 4H, the second electrode 140 is formed on the organic emitting material layer 135 in each sub-pixel region "SP." The second electrode 140 may be formed by depositing one of aluminum (Al) and aluminum (Al) alloy such as aluminum neodymium (AlNd). For example, the first electrode 113 may have a work function higher than the second electrode 140. Similarly to the organic emitting material layer 135, the second electrode 140 is separated and is independently formed in each sub-pixel region "SP" by the separator 130. In addition, since outer surfaces of the first and second projecting parts 125 and 126 are perpendicular to the first electrode 113 differently in an inverted taper structure, the second electrode 140 completely covers the organic material layer 135 in each sub-pixel region "SP" and over the separator 130 in the border region "CA." As a result, the organic emitting material layer 135 is not exposed and deterioration of the organic emitting material layer 135 is prevented. The first electrode 113, the organic emitting material layer 135 and the second electrode 140 constitute the organic EL diode "E."

In accordance with a further aspect of the invention, a getter material or absorbent layer (not shown) can be formed on the second electrode 140. The getter material is preferably a metallic or near metallic material such as calcium or another element from Group IIA of the periodic table of elements. The getter material absorbs water vapor and other gases, such as oxygen generated within the gap region of the display.

Even though not shown in FIGS. 4A to 4H, the connection pattern 180 (FIG. 3) of a conductive material may be formed on the second electrode 140. The connection pattern 180 (FIG. 3) may be formed on the opposite substrate in another embodiment. Next, the first substrate 111 having the organic EL diode "E" and the second substrate 151 having the array element layer are attached using the seal pattern under one of a vacuum condition and an inert gas condition such that the connection pattern 180 contacts the second electrode 140 of the first substrate 111 and the driving TFT "$T_D$" of the second substrate 151.

Consequently, in the dual panel type OELD device according to the present invention, since the separator has a two-fold double layer, the organic emitting material layer is not exposed through the second electrode. Accordingly, deterioration of the organic emitting material layer is prevented. In addition, since the separator includes an inorganic insulating material, the separator does not belch out gases even when heated. Therefore, degradation of the organic emitting material layer due to the belched gases is prevented. Furthermore, since the organic EL diode and the array element layer including TFTs are formed on the first and second substrates, respectively, production yield is improved and fabrication cost is reduced.

It will be apparent to those skilled in the art that various modifications and variations can be made in the organic electroluminescent display device and a fabricating method thereof of the present invention without departing from the spirit or scope of the invention. Thus, it is intended that the present invention covers the modifications and variations of this invention provided they come within the scope of the appended claims and their equivalents.

What is claimed is:

1. An organic electroluminescent display device comprising:
   first and second substrates facing and spaced apart from each other;
   a first electrode on the first substrate;

a separator comprising first and second portions on the first electrode, the first portion having a first projecting part and a first region that is partially enclosed by the first projecting part and the second portion having a second projecting part and a second region that is partially enclosed by the second projecting parts, wherein the first and second projecting parts project toward each other, wherein the first projecting part and the first region have a different layer from each other, and wherein the second projecting part and the second region have a different layer from each other;

an organic emitting layer on the first electrode in a sub-pixel region and having a first thickness;

a second electrode on the organic emitting layer;

an array element layer on the second substrate, the array element layer including a thin film transistor; and a connection pattern electrically connecting the second electrode and the thin film transistor.

2. The device according to claim 1, wherein the second electrode completely covers the organic emitting layer.

3. The device according to claim 1, wherein the first and second regions of the first and second portions have a second thickness and are spaced apart from each other by a first distance.

4. The device according to claim 3, wherein each of the first and second regions have an inner side surface, an outer side surface opposite to the inner side surface, a bottom surface contacting the first electrode and a top surface opposite to the bottom surface, wherein the first projecting part includes:
a first section contacting the outer side surface of the first region; and
a second section extending from the first section and contacting the top surface of the first region, and wherein the second projecting part includes:
a third section contacting the outer side surface of the second region; and
a fourth section extending from the third section and contacting the top surface of the second region.

5. The device according to claim 4, wherein the second sections of each portion are spaced apart from each other by a second distance smaller than the first distance.

6. The device according to claim 3, wherein the first and second projecting parts and first and second regions each comprises an inorganic insulating material.

7. The device according to claim 6, wherein the first and second regions comprise silicon nitride, and the first and second projecting parts comprise silicon oxide.

8. The device according to claim 3, wherein the second thickness is greater than the first thickness.

9. The device according to claim 1, wherein the first and second projecting parts comprise a material subject to a first etch rate, and the first and second regions comprise a material subject to a second etch rate, wherein the second etch rate is higher than the first etch rate.

10. The device according to claim 3, wherein the first and second projecting parts have a third thickness, and wherein the second and third thicknesses are within a range of about 2000 Å to about 8000 Å.

11. The device according to claim 1, wherein the thin film transistor comprises one of a polysilicon device, an amorphous silicon device, or a organic semiconductor device.

12. An organic electroluminescent display comprising:
first and second substrates spaced apart from each other, the first substrate having an electrode thereon;

a separator overlying the electrode and defining a pixel region on the first and second substrates, the separator comprising reciprocal first and second portions defining a border area of the electrode, the first portion including a first region overlying the electrode and a first projecting part overlying an upper surface of the first region and extending beyond an edge of the first region, the second portion including a second region overlying the electrode and a second projecting part overlying an upper surface of the second region and extending beyond an edge of the second region, wherein the first projecting part and the first region have a different layer from each other, and wherein the second projecting part and the second region have a different layer from each other; and an organic emitting layer overlying the electrode and the first and second projecting parts of the first and second portions.

13. The display according to claim 12, wherein the first region and the first projecting part of the first portion comprise different inorganic materials, and wherein the second region and the second projecting part of the second portion comprise different inorganic materials.

14. The display according to claim 12, wherein each of the first and second regions comprises silicon nitride and each of the first and second projecting parts comprises silicon oxide.

15. The display according to claim 12 further comprising:
a second electrode on the organic emitting material layer;
an array element layer on the second substrate, the array element layer including a thin film transistor; and
a connection pattern electrically connecting the second electrode and the thin film transistor.

16. The display according to claim 12, wherein the first and second regions of the first and second portions are spaced apart by a first distance, and wherein the first and second projecting parts of the first and second portions are spaced apart by a second distance smaller than the first distance.

17. The display according to claim 12, wherein the first and second regions of the first and second portions have a first thickness and the organic emitting layer has a second thickness less than the first thickness.

18. The device according to claim 12 further comprising a thin film transistor on the second substrate, wherein the thin film transistor comprises one of a polysilicon device, an amorphous silicon device, or a organic semiconductor device.

* * * * *